United States Patent
Jeong et al.

(10) Patent No.: US 9,841,675 B2
(45) Date of Patent: *Dec. 12, 2017

(54) PHOTOSENSITIVE RESIN COMPOSITION FOR COLOR FILTER AND COLOR FILTER USING THE SAME

(71) Applicant: Samsung SDI Co., Ltd., Yongin-si (KR)

(72) Inventors: Ji-Young Jeong, Uiwang-si (KR); Dong-Wan Kim, Uiwang-si (KR); Ji-Hong Kim, Uiwang-si (KR); Jee-Hyun Ryu, Uiwang-si (KR); In-Jae Lee, Uiwang-si (KR); Gyu-Seok Han, Uiwang-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 284 days.

This patent is subject to a terminal disclaimer.

(21) Appl. No.: 13/942,825

(22) Filed: Jul. 16, 2013

(65) Prior Publication Data

US 2014/0158952 A1     Jun. 12, 2014

(30) Foreign Application Priority Data

Dec. 7, 2012  (KR) .................. 10-2012-0142100

(51) Int. Cl.
*G02B 5/23* (2006.01)
*G03F 7/00* (2006.01)

(52) U.S. Cl.
CPC ................. *G03F 7/0007* (2013.01)

(58) Field of Classification Search
USPC ....................................................... 252/586
See application file for complete search history.

(56) References Cited

U.S. PATENT DOCUMENTS

| | | | |
|---|---|---|---|
| 5,114,817 A | 5/1992 | Urano et al. | |
| 5,346,545 A | 9/1994 | Chassot | |
| 5,998,091 A | 12/1999 | Suzuki | |
| 6,033,813 A | 3/2000 | Endo et al. | |
| 6,649,335 B2 | 11/2003 | Missfeldt | |
| 6,733,935 B2 | 5/2004 | Kishimoto et al. | |
| 7,018,751 B2 | 3/2006 | Andrews et al. | |
| 7,517,619 B2 | 4/2009 | Hosaka et al. | |
| 8,828,630 B2 | 9/2014 | Kwon et al. | |
| 2002/0051926 A1 | 5/2002 | Takashima et al. | |
| 2005/0227178 A1 | 10/2005 | Morita et al. | |
| 2007/0026410 A1* | 2/2007 | Yu .................... | C07H 21/04 435/6.12 |
| 2007/0238802 A1 | 10/2007 | Harada et al. | |
| 2008/0048155 A1 | 2/2008 | Toriniwa et al. | |
| 2008/0053953 A1* | 3/2008 | Yoshibayashi ......... | G02B 5/223 216/24 |
| 2008/0237553 A1 | 10/2008 | Miya et al. | |
| 2009/0263612 A1 | 10/2009 | Gascoyne et al. | |
| 2010/0104985 A1 | 4/2010 | Watanabe | |
| 2011/0049444 A1 | 3/2011 | Sako et al. | |
| 2011/0224334 A1 | 9/2011 | Maeda et al. | |
| 2013/0122422 A1* | 5/2013 | Kwon .................. | G03F 7/027 430/281.1 |

FOREIGN PATENT DOCUMENTS

| | | | |
|---|---|---|---|
| CN | 1372166 A | | 10/2002 |
| CN | 1969205 A | | 5/2007 |
| CN | 101276146 A | | 10/2008 |
| CN | 100501462 C | | 6/2009 |
| CN | 101675117 A | | 3/2010 |
| CN | 102224204 A | | 10/2011 |
| CN | 102604429 A | | 7/2012 |
| CN | 103105731 A | | 5/2013 |
| JP | 04-059874 A | | 2/1992 |
| JP | 05-059291 | | 3/1993 |
| JP | 05-059291 A | | 3/1993 |
| JP | 5059291 | * | 3/1993 |
| JP | 06-041458 A | | 2/1994 |
| JP | 06-199045 A | | 7/1994 |

(Continued)

OTHER PUBLICATIONS

Search Report in counterpart Taiwanese Application No. 102125908 dated Oct. 16, 2014, pp. 1-2.
Ajay K. P. et al., "Photo-Rechargeable Battery Effect in First Generation Cationic-Cyanine Dendrimers", Adv. Mater., 2010, vol. 22, pp. 3954-3958.
Klotz et al., "Homo- and Hetero-[3] Rotaxanes with Two π-Systems Clasped in a Single Macrocycle", J. Am. Chem. Soc., 2006, vol. 128, pp. 15374-15375.
Search Report in commonly owned Chinese Application No. 201210249993.7 dated Feb. 25, 2014, pp. 1-2.
English-translation of Search Report in commonly owned Chinese Application No. 201210249993.7 dated Feb. 25, 2014, pp. 1-2.
Search Report in commonly owned Taiwanese Application No. 101130126 dated Feb. 20, 2014, pp. 1.

(Continued)

*Primary Examiner* — Monique Peets
(74) *Attorney, Agent, or Firm* — Additon, Higgins & Pendleton, P.A.

(57) ABSTRACT

Disclosed are a photosensitive resin composition for a color filter that includes (A) a colorant including a cyanine dye represented by the following Chemical Formula 1, (B) an acrylic-based binder resin, (C) a photopolymerizable monomer, (D) a photopolymerization initiator, and (E) a solvent, and a color filter using the same.

[Chemical Formula 1]

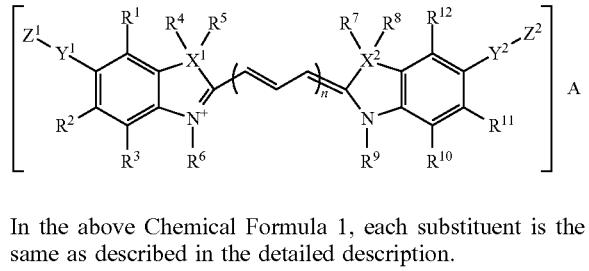

In the above Chemical Formula 1, each substituent is the same as described in the detailed description.

11 Claims, No Drawings

(56) References Cited

FOREIGN PATENT DOCUMENTS

| | | |
|---|---|---|
| JP | 07-140654 A | 6/1995 |
| JP | 2589376 A | 3/1997 |
| JP | 09-230531 A | 9/1997 |
| JP | 10-086517 A | 4/1998 |
| JP | 10-254133 A | 9/1998 |
| JP | 11-015100 A | 1/1999 |
| JP | 2000-019673 A | 1/2000 |
| JP | 2000-356833 A | 12/2000 |
| JP | 2002-040593 A | 2/2002 |
| JP | 2002-062642 A | 2/2002 |
| JP | 2002-072463 A | 3/2002 |
| JP | 2002-072464 A | 3/2002 |
| JP | 2003-280131 | 10/2003 |
| JP | 2005-099416 A | 4/2005 |
| JP | 2005099416 * | 4/2005 |
| JP | 2005-297406 A | 10/2005 |
| JP | 2009-203186 | 9/2009 |
| JP | 2011-186367 A | 9/2011 |
| KR | 10-1994-0007778 | 2/1989 |
| KR | 10-1991-0004717 B1 | 7/1991 |
| KR | 1999-0007097 A | 1/1999 |
| KR | 2002-0015650 A | 2/2002 |
| KR | 2005-0020653 A | 3/2005 |
| KR | 10-2007-0041718 | 4/2007 |
| KR | 10-2008-0088518 A | 10/2008 |
| KR | 10-2009-0096328 | 9/2009 |
| KR | 2009-0106226 A | 10/2009 |
| KR | 10-2009-0126192 A | 12/2009 |
| KR | 2010-0078845 A | 7/2010 |
| KR | 2010-0080142 A | 7/2010 |
| KR | 10-0978185 | 8/2010 |
| KR | 10-2012-0105574 | 9/2012 |
| TW | 200942583 A | 10/2009 |
| WO | 89/01186 | 2/1989 |

OTHER PUBLICATIONS

English-translation of Search Report in commonly owned Taiwanese Application No. 101130126 dated Feb. 20, 2014, pp. 1.

Office Action in commonly owned U.S. Appl. No. 14/101,389 mailed Oct. 7, 2015, pp. 1-12.

Search Report in counterpart Chinese Application No. 201310298057.X dated May 24, 2016, pp. 1-2.

Office Action in commonly owned Application Serial No. 14/101,389 dated Apr. 10, 2017, pp. 1-10.

Office Action in counterpart Chinese Application No. 201310660941.3 dated May 11, 2017, pp. 1-2.

* cited by examiner

PHOTOSENSITIVE RESIN COMPOSITION FOR COLOR FILTER AND COLOR FILTER USING THE SAME

CROSS-REFERENCE TO RELATED APPLICATION

This application claims priority to and the benefit of Korean Patent Application No. 10-2012-0142100 filed in the Korean Intellectual Property Office on Dec. 7, 2012, the entire disclosure of which is incorporated herein by reference.

FIELD

This disclosure relates to a photosensitive resin composition for a color filter and a color filter using the same.

BACKGROUND

Liquid crystal displays can have various advantages such as lightness, thinness, low cost, low power consumption for operation, and improved adherence to an integrated circuit. Liquid crystal displays have been widely used in laptop computers, monitors, and TV screens.

Liquid crystal displays include a color filter formed by repeating a unit pixel, in which three primary color sub-pixels of red (R), green (G), and blue (B) are combined. The unit pixel displays a particular color due to the combination of three primary colors when each sub-pixel is adjacently disposed and then, applied by a color signal and controlled about brightness.

The color filter is made of red (R), green (G), and blue (B) color dyes or pigments. These color materials change white light from a backlight unit into each corresponding color light.

Because the color materials have a spectrum with no unnecessary wavelength other than a required absorption wavelength and a smaller absorption band, display performance of the color filter may be improved. In addition, the color materials are required to have excellent heat resistance, light resistance, and chemical resistance without being faded or discolored when exposed to ultraviolet (UV), acid, and/or base during etching of a color resist.

The color filter can be fabricated using a photosensitive resin composition by dyeing, electrophoretic deposition (EPD), printing, pigment dispersion, and the like, in which three or more colors are coated on a transparent substrate. There have been recent improvements to the pigment dispersion method to provide improved color reproducibility and durability for heat, light, and humidity and thus, pigment dispersion methods have been widely adopted.

However, when a pigment-type photosensitive resin composition is used to fabricate a color filter, the color filter has a limit of deteriorated luminance and contrast ratio due to size and cohesion of pigment particles. In order to improve these limits, research has been conducted on a photosensitive resin composition including a dye that does not form a particle or has a very smaller primary particle diameter. However, the dye-type photosensitive resin composition can have poor heat resistance, light resistance, and chemical resistance and has limited commercial availability. Accordingly, there is a need to improve the reliability of dye-type photosensitive resin compositions for commercial availability.

SUMMARY

One embodiment provides a photosensitive resin composition for a color filter that can have high absorbance and luminance and improved heat resistance and chemical resistance.

Another embodiment provides color filter manufactured using the photosensitive resin composition for a color filter.

One embodiment may include a photosensitive resin composition for a color filter that includes (A) a colorant including a cyanine dye represented by the following Chemical Formula 1; (B) an acrylic-based binder resin; (C) a photopolymerizable monomer; (D) a photopolymerization initiator; and (E) a solvent.

[Chemical Formula 1]

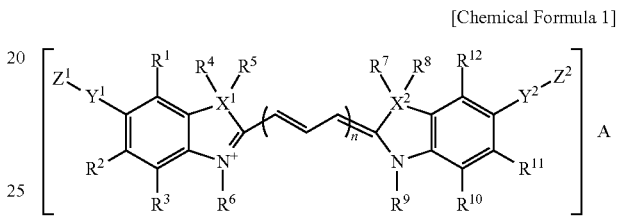

In the above Chemical Formula 1, $X^1$ and $X^2$ are the same or different and are each independently carbon, oxygen, or sulfur, $Y^1$ and $Y^2$ are the same or different and are each independently a single bond, —O—, —(CH$_2$)$_m$COO— (0≤m≤5), —OCO—, —NH—, or —CONH—, $Z^1$ and $Z^2$ are the same or different and are each independently a cyclic substituent having one double bond, $R^1$ to $R^{12}$ are the same or different and are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C2 to C30 heteroaryl, or substituted or unsubstituted C1 to C20 alkyl(meth)acrylate, n is an integer ranging from 1 to 4, and A is a halogen ion, ClO$_4^-$, BF$_4^-$, SbF$_6^-$, CF$_3$SO$_3^-$, N(SO$_2$CF$_3$)$_2^-$, or one of ion compounds represented by the following Chemical Formulae 3-1 and 3-2.

[Chemical Formula 3-1]

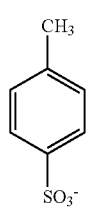

-continued

[Chemical Formula 3-2]

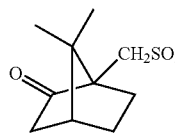

In the above Chemical Formula 1, $Z^1$ and $Z^2$ can be independently a substituent represented by the following Chemical Formula 2-1 or a substituent represented by the following Chemical Formula 2-2.

[Chemical Formula 2-1]

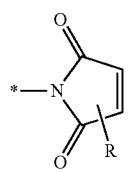

[Chemical Formula 2-2]

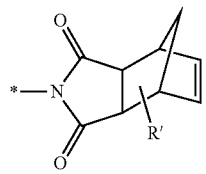

In the above Chemical Formulae 2-1 and 2-2,

R and R' are the same or different and are each independently hydrogen, substituted or unsubstituted C1 to C20 alkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

In the above Chemical Formula 1, $R^4$ to $R^9$ can be independently substituted or unsubstituted C1 to C20 alkyl or substituted or unsubstituted C1 to C20 alkyl(meth)acrylate.

The cyanine dye may have emission wavelength range of about 400 to about 700 nm.

The colorant may further include a metal complex dye and/or a pigment, and the metal complex dye may have a maximum absorption peak at a wavelength of about 200 to about 650 nm.

The metal complex dye may include at least one metal ion of Mg, Ni, Cu, Co, Zn, Cr, Pt, Pd, and/or Fe.

The colorant may include the cyanine dye and the metal complex dye in a weight ratio of about 1:50 to about 50:1.

Examples of the pigment may include without limitation C.I. pigment red 242, C.I. pigment red 214, C.I. pigment red 221, C.I. pigment red 166, C.I. pigment red 220, C.I. pigment red 248, C.I. pigment red 262, C.I. pigment red 254, C.I. pigment red 177, C.I. pigment yellow 150, and combinations thereof.

The colorant may include the cyanine dye and the pigment in a weight ratio of about 1:9 to about 9:1.

The photosensitive resin composition for a color filter may include about 1 to about 80 wt % of the colorant (A); about 0.1 to about 30 wt % of the acrylic-based binder resin (B); about 0.1 to about 30 wt % of the photopolymerizable monomer (C); about 0.1 to about 5 wt % of the photopolymerization initiator (D); and a balance amount of the solvent (E).

Another embodiment provides a color filter manufactured using the photosensitive resin composition for a color filter.

Other embodiments are included in the following detailed description.

The photosensitive resin composition for a color filter can have high luminance and contrast ratio and thus a color filter having improved heat resistance and chemical resistance may be realized.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with a substituent including halogen (F, Cl, Br or I), a hydroxyl group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof, instead of at least one hydrogen.

As used herein, when a specific definition is not otherwise provided, the "heterocycloalkyl group", "heterocycloalkenyl group", "heterocycloalkynyl group" and "heterocycloalkylene group" may refer to cyclic compounds of cycloalkyl, cycloalkenyl, cycloalkynyl and cycloalkylene in which at least one heteroatom of N, O, S, and/or P is present in place of a carbon atom of the cyclic compound.

As used herein, when a specific definition is not otherwise provided, "(meth)acrylate" refers to both "acrylate" and "methacrylate".

The photosensitive resin composition for a color filter according to one embodiment includes (A) a colorant including a cyanine dye represented by the following Chemical Formula 1, (B) an acrylic-based binder resin, (C) a photopolymerizable monomer, (D) a photopolymerization initiator, and (E) a solvent.

Hereinafter, each component is described in detail.

(A) Colorant

The colorant may include a cyanine dye represented by the following Chemical Formula 1.

[Chemical Formula 1]

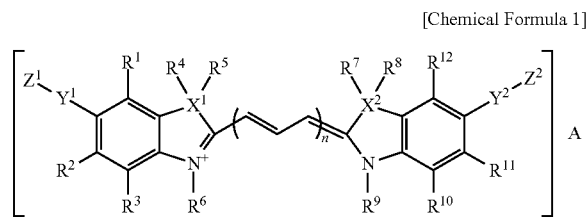

In the above Chemical Formula 1, $X^1$ and $X^2$ are the same or different and are each independently carbon, oxygen, or sulfur.

In the above Chemical Formula 1, $Y^1$ and $Y^2$ are the same or different and are each independently a single bond, —O—, —(CH$_2$)$_m$COO— (0≤m≤5), —OCO—, —NH— or —CONH—.

In the above Chemical Formula 1, $Z^1$ and $Z^2$ are the same or different and each may be a cyclic substituent having one double bond. For example, $Z^1$ and $Z^2$ may be independently a substituent represented by the following Chemical Formula 2-1 or a substituent represented by the following Chemical Formula 2-2.

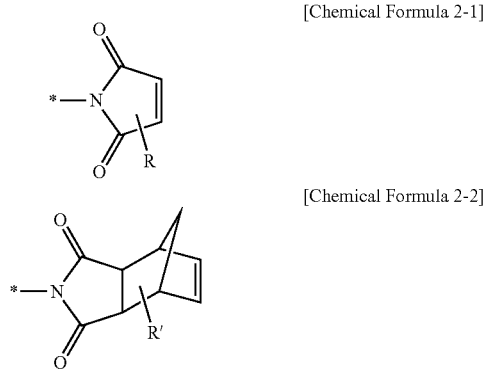

[Chemical Formula 2-1]

[Chemical Formula 2-2]

In the above Chemical Formulae 2-1 and 2-2, R and R' are the same or different and are each independently hydrogen, substituted or unsubstituted C1 to C20 alkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

The cyclic substituent having one double bond is a thermally polymerizable functional group like the substituent represented by the above Chemical Formulae 2-1 and 2-2, and the double bond may be strongly bonded with an acrylate group of the acrylic-based binder resin (B), which will be described, during thermal curing. When the cyanine dye having the cyclic substituent at a terminal end is used as a colorant in the photosensitive resin composition for a color filter, the cyanine dye may have minimal or no color change and/or increased thermal cross-linking with the acrylic-based binder resin. Accordingly, a color filter made using the same may have improved heat resistance and/or chemical resistance.

In the above Chemical Formula 1, $R^1$ to $R^{12}$ are the same or different and are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C2 to C30 heteroaryl, or substituted or unsubstituted C1 to C20 alkyl(meth)acrylate.

Among them, the $R^4$ to $R^9$ may be independently substituted or unsubstituted C1 to C20 alkyl or substituted or unsubstituted C1 to C20 alkyl(meth)acrylate.

In the above Chemical Formula 1, n may be an integer of 1 to 4, for example 1 to 3. When the n is an integer within the above range, a photosensitive resin composition for a color filter may have a high luminance and/or contrast ratio and accordingly may provide a color filter having improved heat resistance and/or chemical resistance.

In the above Chemical Formula 1, A is a halogen ion, $ClO_4^-$, $BF_4^-$, $SbF_6^-$, $CF_3SO_3^-$, $N(SO_2CF_3)_2^-$, or one of the ion compounds represented by the following Chemical Formulae 3-1 and 3-2. In exemplary embodiments, A may be a halogen ion, $CF_3SO_3^-$ or $N(SO_2CF_3)_2^-$.

[Chemical Formula 3-1]

[Chemical Formula 3-2]

The cyanine dye, like conventional dyes, is a molecule absorbing light in the visible region of a spectrum. However, the cyanine dye reemits fluorescent light of the visible spectrum in a larger wavelength than the wavelength of the absorbed light of a conventional dye. For example, the cyanine dye may have a wavelength of a reemitted light of about 400 to about 700 nm.

The cyanine dye may be a red dye.

The cyanine dye may be used to provide a color filter having high transmittance and thus, high luminance. In addition, a cross-linkable terminal end structure is introduced, which can help improve hardness due to terminal cross-linking. This can help provide a color filter having improved performance in terms of high heat resistance and/or chemical resistance.

The colorant may further include a metal complex dye and/or a pigment as well as the cyanine dye.

The metal complex dye may be a compound having a maximum absorption peak at a wavelength of about 200 to about 650 nm. In order to match a color combination with color coordinates, a compound having an absorption wavelength within the above range may use metal complex dyes of all colors that can be dissolved in an organic solvent.

The metal complex dye may use a yellow dye having a maximum absorption peak in the wavelength of about 200 to about 400 nm, an orange dye having a maximum absorption peak in the wavelength of about 300 to about 500 nm, and/or a red dye having a maximum absorption peak in the wavelength of about 500 to about 650 nm.

The metal complex dye may include a direct dye, acidic dye, basic dye, acidic mordant dye, sulfur dye, reduction dye, azoic dye, disperse dye, reactivity dye, oxidation dye, alcohol soluble dye, azo dye, anthraquinone dye, indigoid dye, carbonium ion dye, phthalocyanine dye, nitro dye, quinoline dye, cyanine dye, polymethine dye, or a combination thereof.

The metal complex dye may include at least one metal ion of Mg, Ni, Cu, Co, Zn, Cr, Pt, Pd, and/or Fe.

The metal complex dye may include a composite of a metal ion and at least one selected from solvent yellow 19, solvent yellow 21, solvent yellow 25, solvent yellow 79, solvent yellow 82, solvent yellow 88, solvent orange 45, solvent orange 54, solvent orange 62, solvent orange 99, solvent red 8, solvent red 32, solvent red 109, solvent red 112, solvent red 119, solvent red 124, solvent red 160, solvent red 132, and solvent red 218.

When the cyanine dye and the metal complex dye are mixed, high luminance and contrast ratio may be obtained simultaneously.

The colorant may include the cyanine dye and the metal complex dye in a weight ratio of about 50:1 to about 1:50, for example about 30:1 to about 1:30, and as another example about 5:1 to about 1:5. Within the above weight ratio ranges, luminance and contrast ratio may be more improved.

Specifically, a color filter having transmittance of greater than or equal to about 95% at about 500 to about 800 nm may be realized.

The cyanine dye and the metal complex dye may have a solubility of greater than or equal to about 5, for example about 5 to about 10 with respect to a solvent used in a photosensitive resin composition in accordance with one embodiment, that is, the solvent (E), which is to be described later. The solubility may be obtained by the amount (g) of the dye that is dissolved in about 100 g of the solvent. When the solubility of the cyanine dye and the metal complex dye is within the above range, coloring properties and compatibility with other components that constitute the photosensitive resin composition according to one embodiment may be obtained and the dye may be prevented from being precipitated.

Examples of the solvent may include without limitation propylene glycol monomethylether acetate (PGMEA), ethyl lactate (EL), ethylene glycol ethyl acetate (EGA), cyclohexanone, and the like, and combinations thereof.

The cyanine dye can have high heat resistance. In other words, when measured with a thermogravimetric analyzer (TGA), thermal decomposition temperature may be higher than or equal to about 200° C., for example about 200 to about 400° C.

A dye having this characteristic may be used to produce a color filter, such as those in LCDs and LEDs, that can have high luminance and high contrast ratio in desired color coordinates.

The pigment may be a red pigment.

Examples of the red pigment may include without limitation C.I. pigment red 242, C.I. pigment red 214, C.I. pigment red 221, C.I. pigment red 166, C.I. pigment red 220, C.I. pigment red 248, C.I. pigment red 262, C.I. pigment red 254, C.I. pigment red 177, and the like. The red pigment may be used singularly or as a mixture of two or more.

The pigment may include a yellow pigment, such as C.I. pigment yellow 150, as an auxiliary pigment to obtain the characteristics of a given color.

The pigment may be prepared as a dispersion and included in a photosensitive resin composition. The pigment dispersion may include the pigment and solvent, a dispersing agent, a binder resin, and the like.

Examples of the solvent may include without limitation ethylene glycol acetate, ethyl cellosolve, propylene glycol methyl ether acetate, ethyl lactate, polyethylene glycol, cyclohexanone, propylene glycol methyl ether, and the like, and combinations thereof. In exemplary embodiments, propylene glycol methyl ether acetate may be used.

The dispersing agent helps to uniformly disperse the pigment. The dispersing agent may include a non-ionic, anionic, and/or cationic dispersing agent. Examples of the dispersing agent may include without limitation polyalkylene glycol and/or esters thereof, polyoxy alkylenes, polyhydric alcohol ester alkylene oxide addition products, alcohol alkylene oxide addition products, sulfonate esters, sulfonate salts, carboxylate esters, carboxylate salts, alkyl amide alkylene oxide addition products, alkyl amines, and the like. They may be used singularly or as a mixture of two or more.

The binder resin may include an acrylic-based resin including a carboxyl group. The acrylic-based binder resin may help improve pattern formation of pixels as well as stability of a pigment dispersion.

The pigment may have a primary particle diameter ranging from about 10 to about 70 nm. When the pigment has a primary particle diameter within the above range, pigment dispersion stability and resolution of pixels may be excellent.

There is no particular limit to the secondary particle diameter of the pigment. The pigment may have a secondary particle diameter of less than or equal to about 200 nm, for example, ranging from about 70 to about 100 nm, taking into account pixel resolution.

The colorant may include the cyanine dye and the pigment in a weight ratio of about 1:9 to about 9:1, for example about 3:7 to about 7:3.

Within the above weight ratio ranges of cyanine dye and pigment, luminance and contrast ratio may be more improved while maintaining color characteristics.

The photosensitive resin composition may include the colorant in an amount of about 1 to about 80 wt %, for example about 50 to about 70 wt % based on the total amount (weight) of the photosensitive resin composition for a color filter. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %.

Further, according to some embodiments of the present invention, the amount of the colorant can be in a range from about any of the foregoing amounts to about any other of the foregoing amounts.

Within the above ranges of the colorant, high luminance and contrast ratio at a desired color coordinate may be realized.

(B) Acrylic-Based Binder Resin

The acrylic-based binder resin is a copolymer of a first ethylenic unsaturated monomer and a second ethylenic unsaturated monomer that is copolymerizable with the first ethylenic unsaturated monomer, and may be a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like, and combinations thereof.

The acrylic-based binder resin may include the first ethylenic unsaturated monomer in an amount ranging from about 5 to about 50 wt %, for example, from about 10 to about 40 wt %, based on the total amount (weight) of the acrylic-based binder resin. In some embodiments, the acrylic-based binder resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of two or more.

Examples of the acrylic-based binder resin may include without limitation methacrylic acid/benzylmethacrylate copolymers, methacrylic acid/benzylmethacrylate/styrene copolymers, methacrylic acid/benzylmethacrylate/2-hydroxyethylmethacrylate copolymers, methacrylic acid/benzyl methacrylate/styrene/2-hydroxyethylmethacrylate copolymers, and the like. They may be used singularly or as a mixture of two or more.

The acryl-based binder resin may have a weight average molecular weight ranging from about 3000 to about 150,000 g/mol, for example, from about 5000 to about 50,000 g/mol, and as another example, from about 20,000 to about 30,000 g/mol. When the acrylic-based binder resin has a weight average molecular weight within the above range, the composition may have an excellent close contacting (adhesive) property with a substrate, good physical and chemical properties, and appropriate viscosity.

The acrylic-based binder resin may have an acid value ranging from about 15 to about 60 mgKOH/g, for example, from about 20 to about 50 mgKOH/g. When the acrylic-based binder resin has an acid value within the above range, it can bring about excellent pixel resolution.

The photosensitive resin composition may include the acrylic-based binder resin in an amount ranging from about 0.1 to about 30 wt %, for example, from about 5 to about 20 wt %, based on the total amount (weight) of the photosensitive resin composition. In some embodiments, the photosensitive resin composition may include the acrylic-based binder resin in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, the composition may have an excellent developing property and improved cross-linking, and thus can provide excellent surface flatness when fabricated into a color filter.

(C) Photopolymerizable Monomer

The photopolymerization monomer may include a multi-functional monomer having two or more hydroxyl groups. Examples of the photopolymerization monomer may include without limitation glycerolacrylate, dipentaerythritolhexaacrylate, ethyleneglycoldiacrylate, triethyleneglycoldiacrylate, 1,4-butanedioldiacrylate, 1,6-hexanedioldiacrylate, neopentylglycoldiacrylate, pentaerythritoldiacrylate, pentaerythritoltriacrylate, pentaerythritol diacrylate, dipentaerythritoltriacrylate, dipentaerythritolacrylate, pentaerythritolhexaacrylate, bisphenol A diacrylate, trimethylolpropanetriacrylate, novolacepoxyacrylate, ethyleneglycoldimethacrylate, diethyleneglycoldimethacrylate, triethyleneglycoldimethacrylate, propyleneglycoldimethacrylate, 1,4-butanedioldimethacrylate, 1,6-hexanedioldimethacrylate, and the like, and combinations thereof.

The photosensitive resin composition may include the photopolymerization monomer in an amount ranging from about 0.1 to about 30 wt %, for example, from about 5 to about 20 wt %, based on the total amount (weight) of the photosensitive resin composition. In some embodiments, the photosensitive resin composition may include the photopolymerization monomer in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the photopolymerization monomer can be in a range from about any of the foregoing amounts to about any other of the foregoing amounts.

When the photopolymerization monomer is included in an amount within the above range, the composition may have excellent pattern characteristics and developing property.

(D) Photopolymerization Initiator

The photopolymerization initiator is one generally used for preparing a photosensitive resin composition for a color filter. Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxyacetophenone, 2,2'- dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphtho-1-yl)-4,6-bis(trichloromethyl)-s-triazine, 2-(4-methoxynaphtho1-yl)-4,6-bis(trichloromethyl)-s-triazine, 2-4-tri chloromethyl(piperonyl)-6-triazine, 2-4-trichloromethyl (4'-methoxystyryl)-6-triazine, and the like, and combinations thereof.

Examples of the oxime-based compound may include without limitation 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, and the like, and combinations thereof.

The photopolymerization initiator may include a carbazole-based compound, a diketone-based compound, a sulfonium borate-based compound, a diazo-based compound, a biimidazole-based compound, and the like, or a combination thereof, in addition to or as an alternative to the aforementioned photopolymerization initiators.

The photosensitive resin composition may include the photopolymerization initiator in an amount ranging from about 0.1 to about 5 wt %, for example, from about 1 to about 3 wt %, based on the total amount (weight) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, or 5 wt %. Further, according to some embodiments of the present invention, the amount of the photopolymerization initiator can be in a range from about any of the foregoing amounts to about any other of the foregoing amounts.

When the photopolymerization initiator is included in an amount within the above range, the composition may be sufficiently photopolymerized when exposed to light during the pattern-forming process for preparing a color filter, and can accomplish excellent sensitivity and improve transmittance.

(E) Solvent

The solvent is not specifically limited. Examples of the solvent include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylethyl acetate, propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxyacetate alkyl esters such as methyl oxyacetate, ethyl oxyacetate, butyl oxyacetate, and the like; alkoxy alkyl acetate esters such as methoxy methyl acetate, methoxy ethyl acetate, methoxy butyl acetate, ethoxy methyl acetate, ethoxy ethyl acetate, and the like; 3-hydroxy propionic acid alkyl esters such as 3-hydroxy methyl propionate, 3-hydroxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-hydroxy propionic acid alkyl esters such as 2-hydroxy methyl propionate, 2-hydroxy ethyl propionate, 2-hydroxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-hydroxy-2-methyl propionic acid esters such as 2-hydroxy-2-methyl methyl propionate, 2-hydroxy-2-methyl ethyl propionate, and the like; monooxy monocarboxylic acid alkyl esters of a 2-alkoxy-2-methyl propionic acid alkyl such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate; or ketonic acid esters such as ethyl pyruvate, and the like. Further examples of the solvent may include without limitation N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, carbonate ethylene, carbonate propylene, phenyl cellosolve acetate, and the like. These solvents may be used singularly or as a mixture thereof.

The solvent, considering miscibility, reactivity, and the like, may include glycol ethers such as ethylene glycol monoethyl ether and the like; ethylene glycol alkylether acetates such as ethyl cellosolve acetate and the like; esters such as 2-hydroxy ethyl propionate and the like; diethylene glycols such as diethylene glycol monomethyl ether and the like; or propylene glycol alkylether acetates such as propylene glycol monomethylether acetate, propylene glycol propylether acetate, and the like; and combinations thereof.

The photosensitive resin composition may include the solvent in a balance amount, for example, in an amount ranging from about 20 to about 90 wt %, based on the total amount (weight) of the photosensitive resin composition for a color filter. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have excellent coating properties and maintain improved flatness in a layer having a thickness of greater than or equal to about 3 μm.

(F) Surfactant

The photosensitive resin composition for a color filter may further include a surfactant to uniformly disperse the pigment into the solvent and to improve leveling performance.

The surfactant may be a fluorine-based surfactant and/or a silicone-based surfactant.

Examples of the fluorine-based surfactant may include without limitation F-482, F-484, F-478, and the like, and combinations thereof made by DIC Corporation.

Examples of the silicone-based surfactant may include without limitation TSF400, TSF401, TSF410, TSF4440, and the like, and combinations thereof made by Toshiba Silicone Co., Ltd.

The photosensitive resin composition may include the surfactant in an amount ranging from about 0.01 to about 5 parts by weight, for example, from about 0.1 to about 2 parts by weight, based on about 100 parts by weight of the photosensitive resin composition for a color filter. When the surfactant is included in an amount within the above range, the composition may have fewer impurities generated after the development.

(G) Other Additive(s)

The photosensitive resin composition for a color filter may further include other one or more additives. Examples of the additives may include without limitation malonic acid, 3-amino-1,2-propanediol, vinyl- or (meth)acryloxy-containing silane-based coupling agents, and the like, and combinations thereof, in order to prevent stains or spots during the coating, to adjust leveling, and/or to prevent pattern residue due to non-development. The amount of the additives used may be adjusted depending on desired properties.

In addition, the photosensitive resin composition for a color filter may additionally include an epoxy compound to improve the close contacting (adhesive) property and other characteristics if needed.

Examples of the epoxy compound may include without limitation epoxy novolac acrylic carboxylate resins, ortho cresol novolac epoxy resins, phenol novolac epoxy resins, tetra methyl biphenyl epoxy resins, bisphenol A-type epoxy resins, alicyclic epoxy resins, and the like, and combinations thereof.

When the epoxy compound is included, a peroxide initiator and/or a radical polymerization initiator such as an azobis-based initiator can be additionally included.

The photosensitive resin composition may include the epoxy compound may in an amount of about 0.01 to about 5 parts by weight based on about 100 parts by weight of the photosensitive resin composition for a color filter. When the epoxy compound is included in an amount within the above range, storage, close contacting (adhesive), and other properties may be improved.

The method for making the photosensitive resin composition for a color filter is not particularly limited. The photosensitive resin composition can be prepared by mixing the aforementioned colorant, acrylic-based binder resin, photopolymerization initiator, photopolymerization monomer, and solvent, and optionally the additive(s).

According to another embodiment, provided is a color filter manufactured using the photosensitive resin composition for a color filter.

This color filter may be fabricated using any suitable method. For example, the photosensitive resin composition can be applied to a substrate using any suitable method such as but not limited to spin-coating, roller-coating, slit-coating, and the like to provide a coating or layer with a thickness ranging from about 1.5 to about 2.0 μm. After the coating step, the layer can be radiated with (exposed to) a UV ray, an electron beam, or an X-ray to form a pattern required for a color filter. The UV ray may have a wavelength region ranging from about 190 to about 450 nm, for example, from about 200 to about 400 nm. Then, when the coated layer is treated with an alkali developing solution, the unradiated (unexposed) region thereof may be dissolved, forming a pattern for an image color filter. This process can be repeated depending on the necessary number of R, G, and B colors, fabricating a color filter having a desired pattern. In addition, the image pattern acquired by the development can be cured through heat treatment, actinic ray radiation, or the like, to improve crack resistance, solvent resistance, and the like.

Hereinafter, the present invention is illustrated in more detail with reference to examples. These examples, however, are not in any sense to be interpreted as limiting the scope of the invention.

(Preparation of Cyanine Dye)

Synthesis Example 1

A compound (2) is prepared by refluxing 10 g (2 equivalents) of a compound (1) represented by the following Chemical Formula 6 and 3 g (1 equivalent) of triethylorthoformate under 300 ml of a pyridine solution and reacting them for 2 hours, cooling down and distillating the reactant under a reduced pressure to remove a solvent therefrom, pouring ethanol thereinto for precipitation, and drying a precipitate, obtaining a compound represented by the following Chemical Formula 7. 3 g of the compound (2) is dissolved in 300 ml of a dimethylformamide solvent. The solution is mixed with 3.39 g (5 equivalents) of N-hydroxymaleimide. Then, the mixture is cooled down to 0° C., and a solution prepared by dissolving 1.24 g of dicyclohexylcarbodiimide in 100 ml of dimethylformamide is slowly added thereto in a dropwise fashion. The mixed solution is reacted at room temperature for 36 hours, and 1 L of an ether solvent is poured thereinto, forming a precipitate. The precipitate is filtered and dried, obtaining a cyanine dye (3) represented by the following Chemical Formula 8.

[Chemical Formula 6]

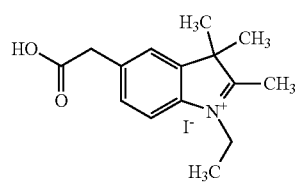
(1)

[Chemical Formula 7]

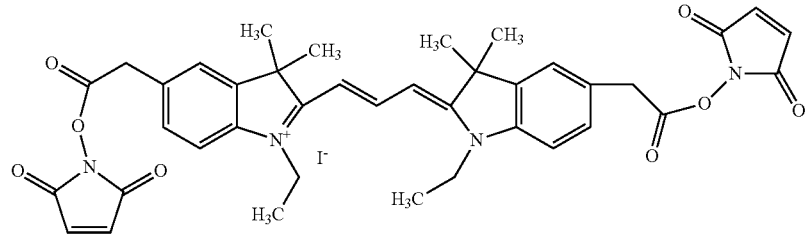
(2)

[Chemical Formula 8]

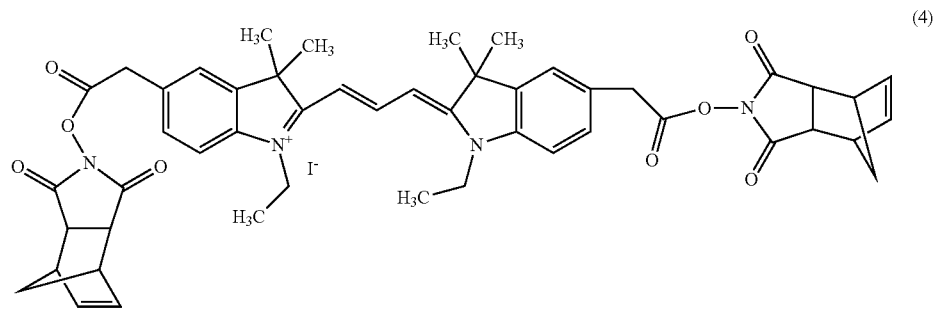
(3)

Synthesis Example 2

A cyanine dye (4) represented by the following Chemical Formula 9 is prepared according to the same method as Synthesis Example 1 except for using N-hydroxy-5-norbornene-2,3-dicarboxylimide instead of N-hydroxymaleimide.

[Chemical Formula 9]

(4)

(Preparation of Photosensitive Resin Composition for Color Filter)

A photosensitive resin composition is prepared using the following components.

(A) Colorant
(A-1) Cyanine Dye
(A-1-1) The cyanine dye (3) according to Synthesis Example 1 is used.
(A-1-2) The cyanine dye (4) according to Synthesis Example 2 is used.
(A-1-3) R008 (Kyung-In Synthetic Corporation) is used.

(A-2) Metal Complex Dye
YELLOW 2GLN (BASF Co.) is used.

(A-3) Pigment
(A-3-1) A mixture of a C.I. pigment red 254 and a C.I. pigment red 177 mixed in a weight ratio of 60:40 and including a solid content of 4.9% is used.
(A-3-2) A C.I. pigment yellow 150 is used.
(B) Acrylic-Based Binder Resin
A methacrylic acid/benzylmethacrylate copolymer having a weight average molecular weight of 28,000 g/mol, which are mixed in a weight ratio of 30:70, is used.
(C) Photopolymerizable Monomer Dipentaerythritolhexaacrylate is used.

(D) Photopolymerization Initiator

CGI-124 made by Ciba Specialty Chemicals Co. is used.

(E) Solvent

Propylene glycol monomethyl ether acetate is used.

(F) Surfactant

A fluorine-based surfactant (F-554, DIC Co., Ltd.) is used.

Example 1

1.7 g of the photopolymerization initiator (D) is dissolved in 65 g of propylene glycol monomethyl ether acetate as the solvent (E), and the solution is agitated at room temperature for 2 hours. Next, 3 g of the cyanine dye 3 (A-1-1) and 1.8 g of the metal complex dye (A-2) as the colorant A are added to the agitated solution. The resulting mixture is agitated again for 30 minutes, and 12 g of the acrylic-based binder resin (B) and 16 g of the photopolymerizable monomer (C) are added thereto. The obtained mixture is agitated at room temperature for 2 hours. Then, 0.5 g of the surfactant (F) is added to the agitated mixture, and the resulting mixture is agitated at room temperature for one hour. The solution is three times filtered to remove impurities, preparing a photosensitive resin composition for a color filter.

Example 2

A photosensitive resin composition for a color filter is prepared according to the same method as Example 1 except for using the cyanine dye (4) (A-1-2) instead of the cyanine dye 3 (A-1-1).

Example 3

A photosensitive resin composition for a color filter is prepared according to the same method as Example 1 except for using 1.5 g of the cyanine dye 3 (A-1-1) and 1.5 g of R008 (A-1-3) instead of 3 g of the cyanine dye (3) (A-1-1).

Example 4

A photosensitive resin composition for a color filter is prepared according to the same method as Example 2 except for using 1.5 g of the cyanine dye (4) (A-1-2) and 1.5 g of R008 (A-1-3) instead of 3 g of the cyanine dye 3 (A-1-1).

Example 5

1.7 g of the photopolymerization initiator (D) is dissolved in propylene 45 g of glycol monomethyl ether acetate as the solvent (E), and the solution is agitated at room temperature for 2 hours. Next, 1 g of the cyanine dye (3) (A-1-1) and 0.8 g of the metal complex dye (A-2) are added to the agitated solution for 30 minutes, and 15 g of the acrylic-based binder resin (B) and 20 g of the photopolymerizable monomer (C) are added thereto. The mixture is agitated at room temperature for 2 hours. Herein, 14 g of the pigment (A-3-1) and 2 g of the pigment (A-3-2) are added to the agitated mixture. The resulting mixture is agitated at room temperature for one hour, and 0.5 g of the surfactant (F) is added thereto, and the obtained mixture is agitated at room temperature for one hour. The solution is three times filtered to remove impurities, preparing a photosensitive resin composition for a color filter.

Example 6

A photosensitive resin composition for a color filter is prepared according to the same method as Example 5 except for using the cyanine dye (4) (A-1-2) instead of the cyanine dye (3) (A-1-1).

Comparative Example 1

2 g of the photopolymerization initiator (D) is dissolved in 45 g of propylene glycol monomethyl ether acetate as the solvent (E), and the solution is agitated at room temperature for 2 hours. Next, 5 g of the acrylic-based binder resin (B) and 10 g of the photopolymerizable monomer (C) are added to the agitated solution, and the mixture is agitated at room temperature for 2 hours.

Then, 33.7 g of the pigment (A-3-1) and 3.8 g of the pigment (A-3-2) are added to the agitated mixture. The resulting mixture is agitated at room temperature for one hour, and 0.5 g of the surfactant (F) is added thereto. The obtained mixture is agitated at room temperature for one hour. The solution is three times filtered to remove impurities, preparing a photosensitive resin composition for a color filter.

(Pattern Formation for Color Filter)

The photosensitive resin compositions for a color filter according to Examples 1 to 6 and Comparative Example 1 are respectively coated to be 2.5 to 3.5 µm thick on a 1 mm-thick glass substrate after fat-removal and wash and dried on a hot plate at 90° C. for 90 seconds, obtaining a film strip. Next, a photomask is put on the film strip and exposed to light at 100 mJ by using a high pressure mercury lamp having a wavelength of 365 nm and dried in a forced convection drying oven at 220° C. for 28 minutes, obtaining a thin film.

Evaluation 1:

Luminance and Contrast Ratio of Thin Film

The color coordinate and luminance and contrast ratio of the thin films according to Examples 1 to 6 and Comparative Example 1 are measured using the following methods. The results are provided in the following Table 1.

(1) Color coordinates (x and y) and luminance (Y): a colorimeter (MCPD 3000, Korea Otsuka Pharmaceutical Co., Ltd.) is used.

(2) Contrast ratio: a contrast ratio measurement device (CT-1, 30,000:1, Tsubosaka Electronic Co. Ltd.) is used.

Evaluation 2:

Chemical Resistance of Thin Film

The thin film specimens according to Examples 1 to 6 and Comparative Example 1 are dipped in and taken out of a mixed solvent of N-methylpyrrolidone (NMP) and ethylenediglycoldimethylethylether (EDM) at room temperature for 10 minutes and dried. Then the color difference before/after the experiment is measured using a color meter. The color differences are converted into del (E*) for comparison. The evaluation is performed based on the following three criteria, and the results are provided in the following Table 1.

◯: No pattern change and del (E*) of less than 2.5

: A little pattern change or del (E*) ranging from greater than or equal to 2.5 and less than 3.5 x: Pattern change or del (E*) of greater than or equal to 3.5

Evaluation 3:

Heat Resistance Evaluation of Thin Film

The thin film specimens according to Examples 1 to 6 and Comparative Example 1 are three times repetitively put in and taken out of an oven at 220° C. and dried. Then the color difference before/after the experiment is measured using a color meter. The color difference is converted into del (E*) for comparison. The evaluation is performed based on the following three criteria. The results are provided in the following Table 1.

○: No pattern change and del (E*) of less than 2.5
: A little pattern change or del (E*) ranging from greater than or equal to 2.5 and less than 3.5
x: Pattern change or del (E*) of greater than 3.5

TABLE 1

| | Color coordinate | | Luminance | Contrast | Chemical resistance | Heat resistance |
|---|---|---|---|---|---|---|
| | x | y | Y | ratio | | |
| Example 1 | 0.657 | 0.3272 | 19.35 | 11,500 | ○ | ○ |
| Example 2 | 0.657 | 0.3275 | 19.48 | 12.000 | ○ | ○ |
| Example 3 | 0.657 | 0.3277 | 19.54 | 10,500 | ○ | ○ |
| Example 4 | 0.657 | 0.3273 | 19.50 | 11,500 | ○ | ○ |
| Example 5 | 0.657 | 0.3279 | 19.13 | 12,000 | ○ | ○ |
| Example 6 | 0.657 | 0.3280 | 19.10 | 12,500 | ○ | ○ |
| Comparative Example 1 | 0.657 | 0.3278 | 18.11 | 9,500 | X | |

Referring to Table 1, thin films formed by using the cyanine dyes according to Examples 1 to 6 have a higher luminance and contrast ratio than the film using a pigment instead of the cyanine dye according to Comparative Example 1 and excellent chemical resistance and heat resistance.

Specifically, thin films using the cyanine dyes as a colorant according to Examples 1 to 4 and the thin films using a mixture of the cyanine dye and a pigment according to Examples 5 and 6 have a high luminance and contrast ratio and excellent chemical resistance and heat resistance.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising
(A) a colorant including a cyanine dye represented by the following Chemical Formula 1;
(B) an acrylic-based binder resin;
(C) a photopolymerizable monomer;
(D) a photopolymerization initiator; and
(E) a solvent:

[Chemical Formula 1]

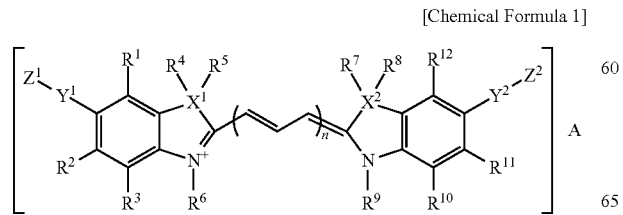

wherein, in the above Chemical Formula 1, $X^1$ and $X^2$ are the same or different and are each independently carbon, oxygen, or sulfur, $Y^1$ and $Y^2$ are the same or different and are each independently a single bond, —O—, —CH$_{2m}$COO— (0≤m≤5), —OCO—, —NH—, or —CONH—, $Z^1$ and $Z^2$ are the same or different and are each independently a substituent represented by the following Chemical Formula 2-1 or a substituent represented by the following Chemical Formula 2-2:

[Chemical Formula 2-1]

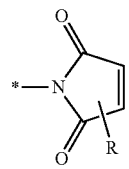

[Chemical Formula 2-2]

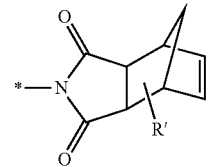

wherein, in the above Chemical Formulae 2-1 and 2-2, and

R and R' are the same or different and are each independently hydrogen, substituted or unsubstituted C1 to C20 alkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $R^1$ to $R^{12}$ are the same or different and are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C2 to C30 heteroaryl, or substituted or unsubstituted C1 to C20 alkyl(meth)acrylate, n is an integer ranging from 1 to 4, and A is a halogen ion, $ClO_4^-$, $BF_4^-$, $SbF_6^-$, $CF_3SO_3^-$, $N(SO_2CF_3)_2^-$, or one of ion compounds represented by the following Chemical Formulae 3-1 and 3-2.

[Chemical Formula 3-1]

[Chemical Formula 3-2]

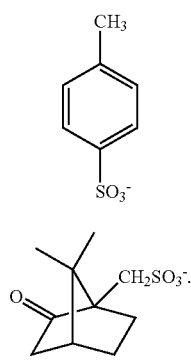

2. The photosensitive resin composition for a color filter of claim 1, wherein in the above Chemical Formula 1, $R^4$ to $R^9$ are the same or different and are each independently substituted or unsubstituted C1 to C20 alkyl or substituted or unsubstituted C1 to C20 alkyl(meth)acrylate.

3. The photosensitive resin composition for a color filter of claim 1, wherein the cyanine dye has a wavelength of a reemitted light of about 400 to about 700 nm.

4. The photosensitive resin composition for a color filter of claim 1, wherein the colorant further comprises a metal complex dye, a pigment, or a combination thereof.

5. The photosensitive resin composition for a color filter of claim 4, wherein the metal complex dye has a maximum absorption peak at a wavelength of about 200 to about 650 nm.

6. The photosensitive resin composition for a color filter of claim 4, wherein the metal complex dye comprises at least one metal ion of Mg, Ni, Cu, Co, Zn, Cr, Pt, Pd, Fe, or a combination thereof.

7. The photosensitive resin composition for a color filter of claim 4, wherein the colorant comprises the cyanine dye and the metal complex dye in a weight ratio of about 1:50 to about 50:1.

8. The photosensitive resin composition for a color filter of claim 4, wherein the pigment comprises C.I. pigment red 242, C.I. pigment red 214, C.I. pigment red 221, C.I. pigment red 166, C.I. pigment red 220, C.I. pigment red 248, C.I. pigment red 262, C.I. pigment red 254, C.I. pigment red 177, C.I. pigment yellow 150, or a combination thereof.

9. The photosensitive resin composition for a color filter of claim 4, wherein the colorant comprises the cyanine dye and the pigment in a weight ratio of about 1:9 to about 9:1.

10. The photosensitive resin composition for a color filter of claim 1, wherein the photosensitive resin composition for a color filter comprises:
about 1 to about 80 wt % of the colorant (A);
about 0.1 to about 30 wt % of the acrylic-based binder resin (B);
about 0.1 to about 30 wt % of the photopolymerizable monomer (C);
about 0.1 to about 5 wt % of the photopolymerization initiator (D); and
a balance amount of the solvent (E).

11. A color filter manufactured using the photosensitive resin composition for a color filter of claim 1.

* * * * *